US005406131A

United States Patent [19]

Shou et al.

[11] Patent Number: 5,406,131

[45] Date of Patent: Apr. 11, 1995

[54] EXPONENTIAL CIRCUIT

[75] Inventors: Guoliang Shou; Weikang Yang; Sunao Takatori; Makoto Yamamoto, all of Tokyo, Japan

[73] Assignee: Yozan Inc., Tokyo, Japan

[21] Appl. No.: 174,064

[22] Filed: Dec. 28, 1993

[30] Foreign Application Priority Data

Dec. 28, 1992 [JP] Japan .................................. 4-361692

[51] Int. Cl.$^6$ ......................... H03K 4/00; H03K 19/00

[52] U.S. Cl. ...................................... 327/100; 327/77; 327/344; 327/346

[58] Field of Search ............... 307/260, 246, 352, 362, 307/353, 520, 490, 350; 328/13, 14, 127; 377/19, 20, 37, 43, 51

[56] References Cited

U.S. PATENT DOCUMENTS

| | | | |
|---|---|---|---|
| 3,982,193 | 9/1976 | Maringer | 328/127 |
| 4,802,194 | 1/1989 | Nishibe | 377/20 |
| 5,220,203 | 6/1993 | McMorrow et al. | 328/127 |

OTHER PUBLICATIONS

Iwai, "The Beginning of Logical Circuit", Tokyo Denki Daigaku Shuppankyoku, pp. 75–77, 1980.

Electrical Engineering Handbook, pp. 1703–1704, 1993.

*Primary Examiner*—Timothy P. Callahan
*Assistant Examiner*—Toan Tran
*Attorney, Agent, or Firm*—Cushman, Darby & Cushman

[57] ABSTRACT

An exponential circuit according to the present invention converts voltage level to time by using a charged voltage of RC circuit $RC_1$, registers time as a clock number at a digital counter and performs bit shift for the registered data.

2 Claims, 2 Drawing Sheets

EXPONENTIAL CIRCUIT

FIELD OF THE INVENTION

This invention relates to an exponential circuit.

BACKGROUND OF THE INVENTION

In recent years, there are arguments about a limitation of a digital computer because of exponential increase in the amount of money for investments for equipment concerning to a minute processing technology, then an analog computer is calling attention. However, analog, a multi-valued register or memory is needed to keep the inside data of an analog computer, such means has not been realized yet.

SUMMARY OF THE INVENTION

The present invention is invented so as to solve the conventional problems and has a purpose to provide an exponential circuit capable of keeping inside data.

An exponential circuit according to the present invention converts voltage level to time by using a charged voltage of RC circuit, then registers time as a number of clocks at a digital counter, and performs a bit-shifting of the registered data.

PREFERRED EMBODIMENT OF THE INVENTION

Hereinafter an embodiment of an exponential circuit according to the present invention is described with referring to the attached drawings.

Figure 1:
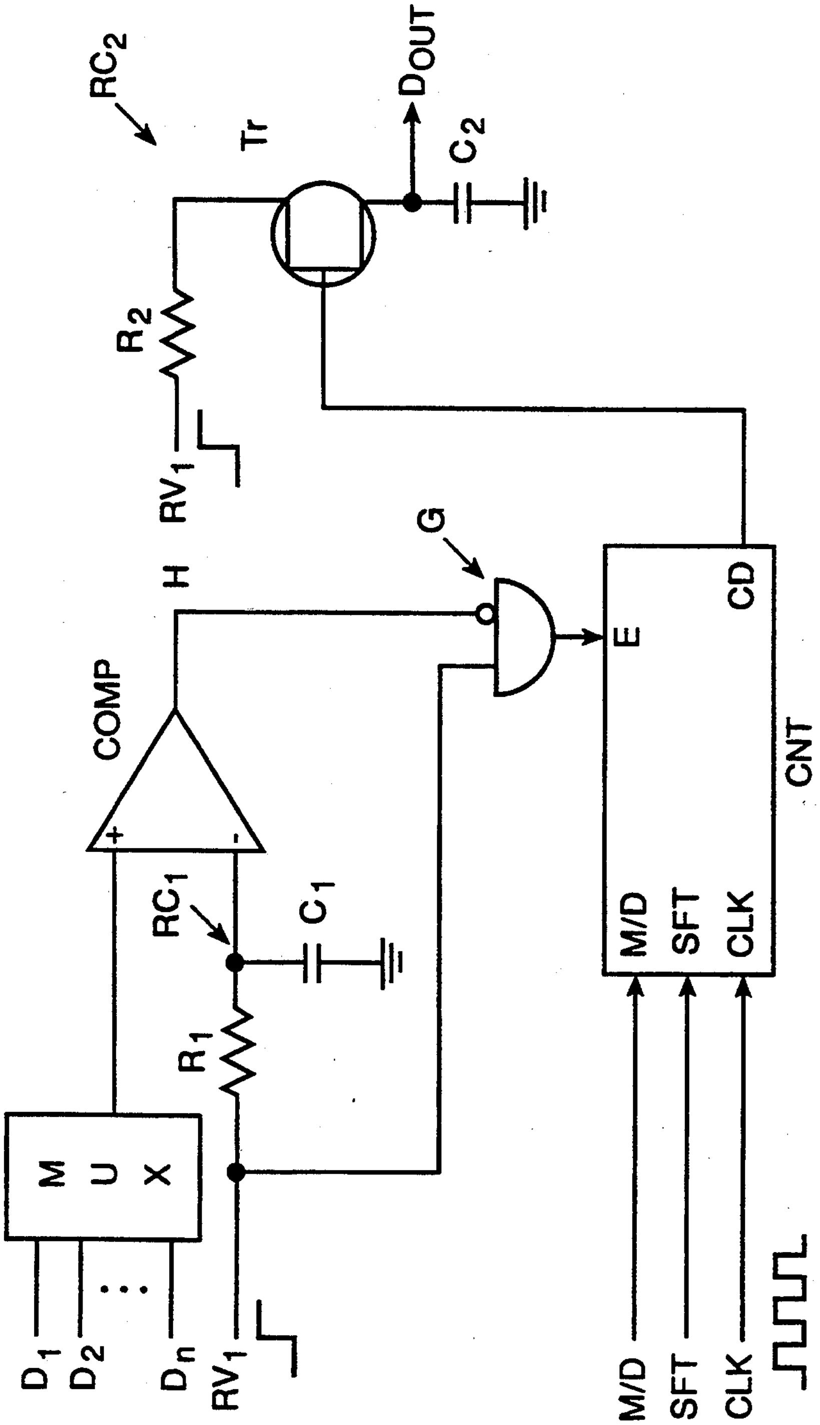
FIG. 1 is a circuit diagram showing the first embodiment of an exponential circuit relating to the present invention.

In FIG. 1, an exponential circuit has a multiplexer MUX selectively outputting analog data from $D_1$ to $D_n$ to be inputted, and outputs of MUX are connected to a comparator COMP as a non-inverted input. The first RC circuit $RC_1$ is connected with an inverted input of COMP and a stepwise starting signal $RV_1$ is input to $RC_1$. $RC_1$ is composed of a resistance $R_1$ connected with $RV_1$ at the first terminal, and of a capacitance $C_1$ connected at the first terminal with the second terminal of $R_1$ and earthed at the second terminal. A juncture point of $C_1$ and $R_1$ is connected with a non-inverted input of COMP.

COMP is an output of "0" when input $(D_k-RV_1)$ is smaller than 0, and becomes an output of active "1" when $(D_k-RV_1)$ is more than O.

An output of COMP and $RV_1$ are input to a logical gate G of $(\overline{COMP}\times RV_1)$, and output of the logical gate is input to a counter CNT as an enable signal E. The counter executes counting during a period from the time when $RV_1$ becomes "1" to the time when COMP becomes "1". CNT has a bit-shift signal input SFT (2 bits), multiplication/division switching signal M/D (1 bit), a clock input CLK and count data output CD and the following signal definitions are predetermined.

TABLE 1

| |
|---|
| When SFT changes from 0 to 1, then a count value performs bit shift. |
| When SFT1 is equal to 0, then a count value shists to the left. |
| When SFT1 is equal to 1, then a count value shifts to the right. |
| When M/D is equal to 1, then CNT is increment. |
| When M/D is equal to 0, then CNT is decrement. |
| CNT counts changes from 0 to 1 of CLK. |
| When a counter value of CNT is positive, then an output is 1. |
| When a counter value of CNT is 0, then an output is 0. |

When M/D is equal to 1, one of analog data from $D_1$ to $D_n$ (it is defined as $D_k$) is selected by MUX, $RV_1$ is defined as "1", $RV_1$ is input to the inverted input of COMP. The electric potential of inverted inputs decreases as $C_1$ is charged. When $(D_k-RV_1)$ becomes "0", COMP outputs a holding signal H(=1). $RV_1$ is input to the gate G simultaneously to input of $RC_1$, then CNT starts counting of CLK and executes increment of count value. CLK is pulse of a predetermined frequency and the final count value of CNT corresponds to a time distance from the time of inputting of $RV_1$ to time when $(D_k-RV_1)$ becomes "0".

Here, if voltage of inverted input of COMP is defined as $V_{in}$ and time corresponding to $D_k$ is defined as $t_k$, then the following formulas are obtained.

$$V_{in}=RV_1\exp(-t_k/R_1C_1)$$

$$t_k=-R_1C_1\log(D_k/RV_1)$$

Finishing the first counting, the count value is held as it is. A new data $D_{k+1}$ is selected with setting M/D to be "0", and $RV_1$ to be "1", then the time $t_{k+1}$ corresponding to $D_{k+1}$ is added to $t_k$. Time represented by the following formula is stored.

$$t_k-t_{k+1}=-R_1C_1\log\{D_k\times D_{K+1}/(RV_1)^2\}$$

The formula shows a time corresponding to a division result of $D_k/D_{k+1}$. Keeping the time as a count value is equivalent to holding the calculation result.

It is possible to perform the same calculation for any number of data, and it is possible to obtain a division result of all data from $D_1$ to $D_k$.

$$D_1^{p1}\times D_2^{p2}\times\ldots\times D_n^{pn}$$

$$pk=1\text{ or }-1$$

A time $Tt\times 2^k$ multiplied a time corresponding to the final result of multiplication and division ( it is defined as Tt ) to $2^k(k=\pm1, \pm2, \ldots)$ is obtained. When the result of multiplication and division is equal to X, and $2^k$ is equal to Y, then following formula is obtained.

$$TtX2^k=-Y(R_1C_1\log X)+YZ=-(R_1C_1)\log X^Y+YZ$$

Z is a constant number.

It is equivalent to an exponential calculation of $X^Y$.

The second RC circuit $RC_2$ with the same characteristics as $RC_1$ is connected with CD in order to read a count value of CNT. $RC_2$ is composed of a resistance $R_2$, and a capacitance $C_2$ connected at the first terminal through a transistor Tr and earthed at tile second terminal. A gate of Tr is connected with CD. Assuming that M/D is equal to 0, a count value is decreased. When the count value is equal to 0, CD becomes 0 and Tr is cutoff. $C_2$ is charged during a period from the time $RV_1$ is equal to 1 to the time CD is equal to 0. The charged voltage at the final charging becomes an analog data $D_{out}$ corresponding to a total time. As a result, a division result as an analog data is calculated.

Figure 2:
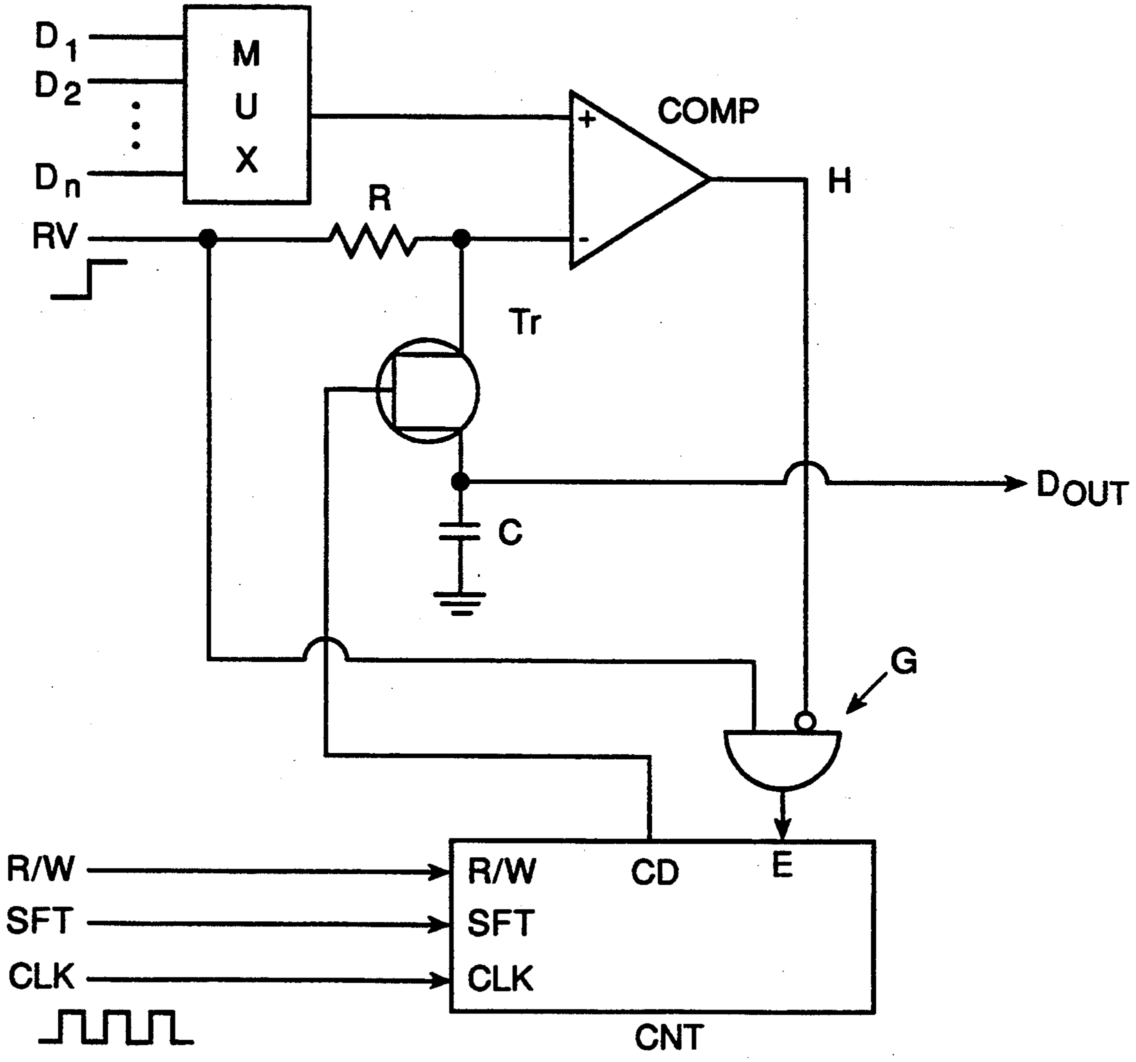
FIG. 2 is a circuit diagram showing the second embodiment of an exponential circuit relating to the present invention.

FIG. 2 shows the second embodiment in which the first and the second RC circuits are common circuits.

Under the condition that CD is equal to 1 and Tr is conductive, when RV becomes "1", C is charged through R and Tr. On stopping of counting after H becomes "1", a time corresponding to a data $D_k$ is added to the count value. When M/D is equal to 0, the count value is decreased, When the value becomes 0, CD is equal to 0, Then Tr is cut-off and the charged voltage of C becomes an output analog data $D_{out}$.

In the second embodiment, RC circuit is commonly used so that the calculation inaccuracy is prevented due to dispersion of performance of different parts in the same LSI.

As mentioned above, an exponential circuit according to the present invention converts voltage level to time by using charged voltage of RC circuit and registers time as a number of clock at a digital counter, so that it is possible to provide a subtraction circuit capable of keeping data inside.

What is claimed is:

1. An exponential circuit comprising:

i) a first RC circuit with a resistance and a capacitance, said capacitance being connected with a first terminal of said resistance at a first terminal and with the earth at a second terminal, provided with an output terminal at the juncture between said resistance and said capacitance, provided with an input terminal at a second terminal of said resistance for receiving a stepwise start signal;

ii) a second RC circuit with a resistance and a capacitance, said capacitance being connected with a first terminal of said resistance at a first terminal and with the earth at a second terminal, provided with an output terminal at the juncture between said resistance and said capacitance, provided with an input terminal at a second terminal of said resistance for receiving said stepwise start signal;

iii) a comparator means for outputting a stop signal when a difference is more than a predetermined value between an output of an input voltage and said first RC circuit;

iv) a counter means for receiving said start signal, said stop signal and a reference clock with a predetermined frequency so as to count number of said reference clock between said start signal and stop signal with increasing number or with decreasing number, said increasing number and decreasing number being alternatively selective; and v) a switching means, receiving an output from said counter means, for disconnecting said resistance from said capacitance of said second RC circuit; and vi) a shifting means for bitwisely shifting data of said counter means.

2. An exponential circuit comprising:

i) a RC circuit with a resistance and a capacitance, said capacitance being connected with a first terminal of said resistance at a first terminal and with the earth at a second terminal, provided with an output terminal at the junction between said resistance and capacitance, provided with an input terminal at a second terminal of said resistance receiving a stepwise start signal;

ii) a switching means for disconnecting said resistance from said capacitance of said RC circuit;

iii) a comparator means for outputting a stop signal when a difference is more than a predetermined value between an output of an input voltage and said RC circuit;

iv) a counter means for receiving said start signal, said stop signal and a reference clock with a predetermined frequency so as to count number of said reference clock between said start signal and stop signal with increasing number or with decreasing number, said increasing number and decreasing number being alternatively selective, and for generating an output signal to control said switching means; and v) a shifting means for bitwisely shifting data of said counter means.

* * * * *